United States Patent [19]

Iwata

[11] Patent Number: 4,802,181
[45] Date of Patent: Jan. 31, 1989

[54] SEMICONDUCTOR SUPERLATTICE LIGHT EMITTING SEVICE

[75] Inventor: Hiroshi Iwata, Tokyo, Japan

[73] Assignee: NEC Corporation, Tokyo, Japan

[21] Appl. No.: 127,015

[22] Filed: Nov. 27, 1987

[30] Foreign Application Priority Data

| Nov. 27, 1986 | [JP] | Japan | 61-283284 |
| Nov. 27, 1986 | [JP] | Japan | 61-283286 |
| Feb. 13, 1987 | [JP] | Japan | 62-31257 |
| Feb. 13, 1987 | [JP] | Japan | 62-31258 |

[51] Int. Cl.$^4$ .............................. H01S 3/19
[52] U.S. Cl. ........................ 372/45; 372/46; 357/4; 357/16; 357/17
[58] Field of Search ............... 372/43, 45, 46; 357/4, 357/16, 17

[56] References Cited

U.S. PATENT DOCUMENTS

| 4,546,480 | 10/1985 | Burnham et al. | 372/46 |
| 4,591,889 | 5/1986 | Gossard et al. | 357/16 |
| 4,704,622 | 11/1987 | Capasso et al. | 357/4 |

OTHER PUBLICATIONS

Petroff et al., "Toward Quantum Well Wires: Fabrication and Optical Properties", Appl. Phys. Lett. 41(7), Oct. 1, 1982, pp. 635-638.

*Primary Examiner*—William L. Sikes
*Assistant Examiner*—Georgia Y. Epps
*Attorney, Agent, or Firm*—Sughrue, Mion, Zinn, Macpeak & Seas

[57] ABSTRACT

A semiconductor superlattice comprises a planar quantum well region and at least one local quantum well region which is in contact with the planar quantum well region or positioned in the inside thereof. The potential is higher in the planar quantum well region than in the local quantum well region so that carriers injected into the planar quantum well region are flowed into the local quantum well region. For the reason, the recombination of the carriers is effectively performed so that a semiconductor laser with a high performance is obtained.

6 Claims, 2 Drawing Sheets

SEMICONDUCTOR SUPERLATTICE LIGHT EMITTING SEVICE

FIELD OF THE INVENTION

The invention relates to a semiconductor superlattice, and more particularly to a semiconductor superlattice which is applicable to a semiconductor laser.

BACKGROUND OF THE INVENTION

One of conventional semiconductor superlattices is described on pages 635 to 638 of "Appl. Phys. Lett. 41(7), Oct. 1, 1982". The semiconductor superlattice is of a quantum well submicron wire structure which comprises linear quantum well regions, and a quantum barrier region surrounding the quantum well regions.

In the semiconductor superlattice, electrons and holes which are confined in the quantum well regions are on the quasi-one dimensional condition. For the reason, the semiconductor superlattice is applicable to a semiconductor laser with a high performance.

Further, a semiconductor laser having an active layer in which quantum well boxes are provided to increase a quantum confinement is proposed in "Jpn. Appl. Phys. 26, (1987) L225".

According to the quantum well submicron wire structure or quantum well box structure, however, a semiconductor laser oscillation can not be obtained by the current injection thereinto for the reason why electrons and holes can not be injected into the quantum well regions effectively.

SUMMARY OF THE INVENTION

Accordingly, it is an object of the invention to provide a semiconductor in which carriers are injected into local quantum well regions effectively.

It is a further object of the invention to provide a semiconductor superlattice in which an oscillation threshold current is low.

It is a still further object of the invention to provide a semiconductor superlattice with a high performance which is applicable to a semiconductor laser.

According to the invention, a semiconductor superlattice comprises, a planar quantum well region having a thickness of approximately electron de Broglie wavelength and the two dimensionally spread quantum states, and at least one local quantum well region which is provided inside said planar quantum well region or is provided to be in contact therewith having a thickness of approximately electron de Broglie wavelength and a length of approximately electron de Broglie wavelength along at least one of the longitudinal and transverse directions parallel to the plane thereof, wherein the energy level of ground state of said local quantum well region is lower than the energy levels of said planar quantum well region.

In the semiconductor superlattice, carriers injected from the outside thereof is inevitably passed through the planar quantum well region so that the major portion of the carriers are confined therein. The carriers thus confined in the planar quantum well region are to be flowed into regions of lower energy levels due to the relaxation in bands so that the carriers are finally positioned in the at least one local quantum well region having lower energy levels. The state of the carriers confined in the local quantum well region is of the quasi-one dimension or quasi-zero dimension in which the carriers are strongly confined therein quantum-mechanically so that a superior luminescence characteristic is obtained therein due to the recombination thereof. For the reason, the semiconductor superlattice described above is well applicable to a semiconductor laser.

BRIEF DESCRIPTION OF THE DRAWINGS

The invention will be described in more detail in conjunction with following drawings wherein.

DESCRIPTION OF THE PREFERRED EMBODIMENTS

Before describing a preferred embodiment according to the invention, a conventional semiconductor superlattice will be explained.

Figure 1:
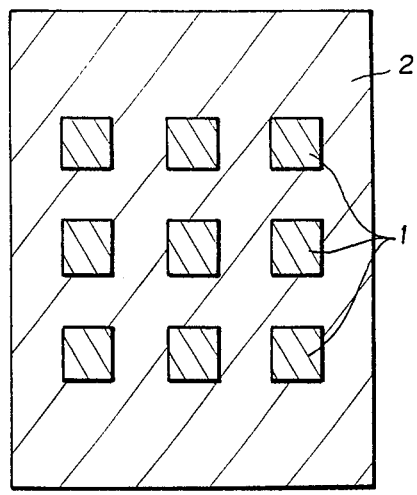
FIG. 1 is a cross sectional view showing a conventional quantum well submicron wire structure.

FIG. 1 shows the conventional semiconductor superlattice which comprises a plurality of linear quantum well regions 1, and a quantum barrier region 2 surrounding the quantum well regions 1.

In the conventional semiconductor superlattice, a semiconductor laser oscillation can not be obtained by the current injection thereinto due to the reason mentioned before.

Figure 2:
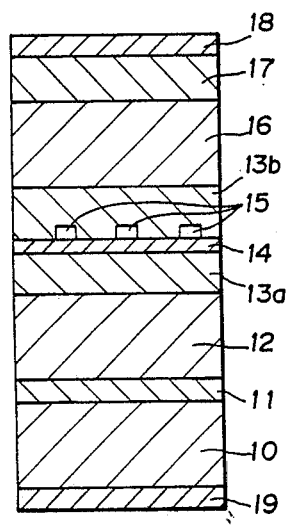
FIG. 2 is a cross sectional view showing a semiconductor laser including a semiconductor superlattice in a first embodiment according to the invention.

Next, a semiconductor laser including a semiconductor superlattice in the first embodiment according to the invention is shown in FIG. 2. The semiconductor laser cmprises a buffer layer 11 of n-GaAs, an n-cladding layer 12 of n-Al0.7Ga0.3As having a thickness of 1 $\mu$m, optical waveguide layers 13a and 13b each of Al0.4Ga0.6As having a thickness of 0.1 $\mu$m, a planar quantum region 14 of Al0.25Ga0.75As having a thickness of 10 nm, local quantum well regions 15 each of a quantum well submicron wire of GaAs having a thickness of 10 nm and width of 30 nm, a p-cladding layer 16 of p-Al0.7Ga0.3As having a thickness of 1 $\mu$m, and a cap layer 17 of p-GaAs which are formed sequentially on a semiconductor substrate 10 of n-GaAs, and p and n electrodes 18 and 19 respectively provided on the upper surface of the cap layer 17 and back surface of the substrate 19.

In the semiconductor layer, a semiconductor superlattice including the planar quantum well region 14 and the local quantum well regions 15 is used as an active layer.

In fabricating the semiconductor laser, the semiconductor crystal growth is performed by molecular beam epitaxy (MBE). At first, the buffer layer 11, n-cladding layer 12, optical waveguide layer 13a, planar quantum well region 14, and a GaAs layer having a thickness of 10 nm are formed on the semiconductor substrate 10. Next, the GaAs layer is etched to provide stripe shaped configurations by the electron beam exposure method and ion beam etching method. As a result, the local quantum well regions 15 are formed to be in contact with the planar quantum well region 14. Thereafter, the optical waveguide layer 13b, p-cladding layer 16, and cap layer 17 are grown thereon by MBE. Finally, the p and n electrodes 18 and 19 are provided on the upper surface of the cap layer 17 and back surface of the semiconductor substrate 10.

In operation, the major portion of holes and electrons which are injected from the p and n electrodes 18 and 19 are injected into the planar quantum well region 14. The holes and electrons thus injected into the planar quantum well region 14 are flowed into the local quantum well regions 15 each having lower potential energy levels. In the respective local quantum well regions 15, the holes and electrons are confined two dimensionally to result in the quasi one dimensional state so that the density of states thereof is converged in a narrow energy region to provide an extremely narrow recombination spectrum. As a result, almost all of the carriers are utilized effectively for a laser oscillation whereby a semiconductor laser having low threshold current is obtained.

In the semiconductor laser mentioned above, it is relatively easy to fabricate the semiconductor superlattice because the local quantum well regions 15 are of a submicron wire structure respectively. Further, there is a further advantage that the crystal growth is easy if a thickness of the planar quantum well region 14 is small because a semiconductor material of the planar quantum well region 14 can be the same as that of the local quantum well regions 15.

Figure 3:
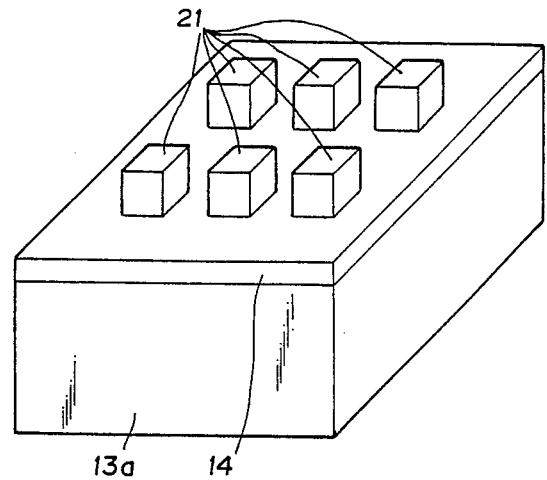
FIG. 3 is a perspective view showing a semiconductor superlattice in a second embodiment according to the invention.

In FIG. 3, there is shown a semiconductor superlattice in the second embodiment according to the invention. The semiconductor superlattice comprises a planar quantum well region 14 provided on an optical waveguide layer 13a, and local quantum well regions 21 each of a quantum well box of GaAs having a thickness of 10 nm, longitudinal length of 30 nm, and transverse length of 30 nm, and is applied to a semiconductor laser as shown in FIG. 2. In the semiconductor laser, each of the local quantum well regions 21 is of a quantum well box, although each of the local quantum well regions 15 is of a quantum well submicron wire in FIG. 2.

In fabricating the semiconductor laser including the semiconductor superlattice in the second embodiment, a buffer layer, an n-cladding layer, the optical waveguide layer 13a, the planar quantum well region 14, and a GaAs layer having a thickness of 10 nm are formed on a semiconductor substrate in the same manner as in the first embodiment. The GaAs layer is then etched to be a plurality of box-like configurations by the electron beam exposure method and ion beam etching method, thereby providing the local quantum well regions 21. Thereafter, the same fabricating process as in the first embodiment is repeated to provide the semiconductor laser.

In the semiconductor laser including the semiconductor superlattice in the second embodimet, holes and electrons are confined three dimensionally in the local quantum well regions 21, thereby resulting in the quasi zero dimensional state so that the density of states is converged in a narrow energy region. For the reason, almost all of carriers are utilized effectively for a laser oscillation so that a semiconductor laser having low threshold current is obtained.

Although the fabrication of the semiconductor laser in the second embodiment is slightly different as compared to that of the semiconductor laser in the first embodiment, the performance thereof is much improved.

Figure 4:
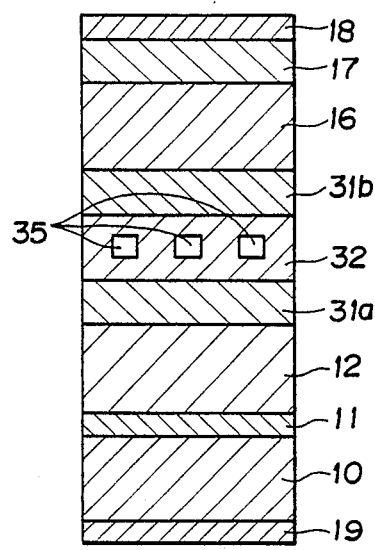
FIG. 4 is a cross sectional view showing a semiconductor laser including a semiconductor superlattice in a third embodiment according to the invention.

In FIG. 4, there is shown a semiconductor laser including a semiconductor superlattice in the third embodiment according to the invention. The semiconductor laser comprises a semiconductor substrate 10 of n-GaAs, a buffer layer 11 of n-GaAs formed on the semiconductor substrate 10, an n-cladding layer 12 of n-Al0.7Ga0.3As having a thickness of 1 μm formed on the buffer layer 11, a quantum barrier 31a of Al0.4Ga0.6As having a thickness of 0.1 μm formed on the n-cladding layer 12, a planar quantum well region 32 of Al0.25Ga0.75As having a thickness of 30 nm formed on the quantum barrier 31a, local quantum well regions 35 each of a quantum well submicron wire of GaAs having a thickness of 10 nm and width of 30 nm formed inside the planar quantum well region 32, a quantum barrier 31b of Al0.4 Ga0.6As having a thcikness of 1 μm formed on the planar quantum well region 32, a p-cladding layer 16 of p-Al0.7Ga0.3As having a thickness of 1 μm, a cap layer 17 of p-GaAs, and p and n electrodes 18 and 19 respectively provided on the upper surface of the cap layer 17 and back surface of the semiconductor substrate 10. In the semiconductor laser, the potential is higher in the quantum barriers 31a and 31b than in the planar quantum well region 32.

In fabricating the semiconductor laser, the semiconductor crystal growth is performed by MBE. At first, the buffer layer 11, n-cladding layer 12, quantum barrier 31a, and planar quantum well region 32 are formed sequentially on the semiconductor substrate 10. Then, the GaAs layer having the thickness of 10 nm is grown on the planar quantum well region 32 by MBE, and is etched to be a plurality of stripe configurations by the electron beam exposure method and ion beam etching method. As a result, the local quantum well regions 35 are formed thereon. Thereafter, the planar quantum well region 32, quantum barrier 31b, p-cladding layer 16, and cap layer 17 are grown sequentially by MBE. Finally, the p and n electrodes 18 and 19 are provided on the upper surface of the cap layer 17 and back surface of the semiconductor substrate 10.

In operation, holes and electrons which are injected from the p and n electrodes 18 and 19 are injected through the quantum barriers 31a and 31b into the planar quantum well region 32 to be confined therein. The holes and electrons thus confined in the planar quantum well region 32 are flowed into the local quantum well regions 35 because potential energy levels of the local quantum well regions 35 are lower than those of the planar quantum well region 32. In the local quantum well regions 35, the holes and electrons are confined two dimensionally to provide the quasi zero dimensional state so that the respective state densities thereof are converged in a narrow energy region to provide a narrow recombination spectrum. For the reason, almost all of carriers are utilized for a laser oscillation so that a semiconductor laser having a threshold level of a small current is obtained.

According to the semicondctor superlattice in the third embodiment, the fabrication thereof is very easy because the tolerance of the layer's thickness is large due to the fact that the planar quantum well region 32 is wide to provide a wider spread of carriers, although the loss of the carriers is increased to a small extent.

Figure 5:
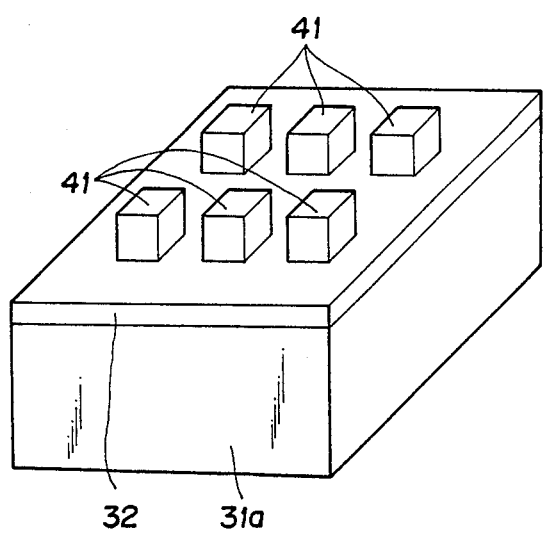
FIG. 5 is a perspective view showing a semiconductor superlattice in a fourth embodiment according to the invention.

In FIG. 5, there is shown a semiconductor superlattice in the fourth embodiment according to the invention. The semiconductor supperlattice comprises a planar quantum well region 32 provided on a quantum barrier 31a, and local quantum well regions 41 each of a quantum well box of GaAs having a thickness of 10 nm, longitudinal length of 30 nm, and transverse length of 30 nm, and is applied to a semiconductor laser as shown in FIG. 4. In the semiconductor laser, each of the local quantum well region 41 is of a quantum well box, although each of the local quantum well regions 35 is of a quantum well submicron wire in FIG. 4.

In fabricating the semiconductor laser, a buffer layer, an n-cladding layer, the quantum barrier 31a, the planar quantum well region 32, and a GaAs layer having a thickness 10 nm are grown sequentially on a semiconductor substrate by MBE. Next, the GaAs layer is etched to be a plurality of cubic configurations by the electron beam exposure method and ion beam etching method, thereby providing a plurality of the local quantum well regions 41. Thereafter, the same process as in the third embodiment is repeated to provide the semiconductor laser.

Although the fabrication of the semiconductor laser in the fourth embodiment is difficult as compared to that of the semiconductor laser in the third embodiment, a semiconductor laser with a high performance is obtained in the fourth embodiment for the same reason as in the second embodiment.

Although a mixed crystal of AlGaAs system is used in the first to fourth embodiments according to the invention, other mixed crystal may be adopted in the invention.

Further, multi-layers of quantum well structures may be adopted in place of a single layer of a quantum well structure in the first to fourth embodiments according to the invention.

Although the invention has been described with respect to specific embodiment for complete and clear disclosure, the appended claims are not to thus limited but are to be construed as embodying all modifications and alternative constructions that may occur to one skilled in the art which fairly fall within the basic teaching herein set forth.

What is claimed is:

1. A semiconductor superlattice comprising:
an active layer composed of a superlattice,
p and n-cladding layers positioned respectively above and beneath the active layer,
means for injecting current into said active layer,
an planar quantum well region having a thickness of approximately electron de Broglie wavelength and the two dimensionally spread quantum state, and
at least one local quantum well region which is provided inside said planar quantum well region having a thickness of approximately electron de Broglie wavelength along at least one of the longitudinal and transverse directions parallel to the plane thereof,
wherein the energy level of ground state of said local quantum well region is lower than the energy levels of said planar quantum well region.

2. A semiconductor superlattice according to claim 1, wherein said planar quantum well region is of a flat plate-like semiconductor, and
said at least one local quantum well region is of a wire-like semiconductor having a width of approximately electron de Broglie wavelength to be in contact with said planar quantum well region.

3. A semiconductor superlattice according to claim 1, wherein said planar quantum well region is of a flat plate-like semiconductor, and
said at least one local quantum well region is of a box-like semiconductor having a size of approximately electron de Broglie wavelength to be in contact with said planar quantum well region.

4. A semiconductor superlattice according to claim 1 further comprising,
quantum barriers being in contact with said planar quantum well region on the both sides thereof,
wherein said planar quantum well region is of a layer-like semiconductor to surround said at least one local quantum well region being of a wire-like semiconductor having a width of approximately electron de Broglie wavelength, and
wherein a forbidden band of a semiconductor material forming said quantum barriers is larger than that of a semiconductor material forming said planar quantum well and the potential is higher in said quantum barriers than in said planar quantum well region.

5. A semiconductor superlattice according to claim 1 further comprising,
quantum barriers being in contact with said planar quantum well region on the both sides thereof,
wherein said planar quantum well region is of a layer-like semiconductor to surround said at least one local quantum well region being of a box-like semiconductor having a size of approximately electron de Broglie wavelength, and
wherein a forbidden band of a semiconductor material forming said quantum barriers is larger than that of a semiconductor material forming said planar quantum well and the potential is higher in said quantum barriers than in said planar quantum well region.

6. A semiconductor superlattice comprising:
an active layer composed of a superlattice,
p and n-cladding layers positioned respectively above and beneath the active layer,
means for injecting current into said active layer,
an planar quantum well region having a thickness of approximately electron de Broglie wavelength and the two dimensionally spread quantum state, and
at least one local quantum well region which is provided to be in contact therewith having a thickness of approximately electron de Broglie wavelength along at least one of the longitudinal and transverse directions parallel to the plane thereof,
wherein the energy level of ground state of said local quantum well region is lower than the energy levels of said planar quantum well region.

* * * * *

UNITED STATES PATENT AND TRADEMARK OFFICE
CERTIFICATE OF CORRECTION

PATENT NO. : 4,802,181

DATED : January. 31, 1989

INVENTOR(S) : HIROSHI IWATA

It is certified that error appears in the above-identified patent and that said Letters Patent is hereby corrected as shown below:

Col. 1, line 25, delete "26" and insert --26--.

Col. 4, line 19, delete "thcikness" and insert --thickness-.

Claim 2, line 1, delete "Claim 1" and insert --Claim 6--.

Claim 3, line 1, delete "Claim 1" and insert --Claim 6--.

Signed and Sealed this

Third Day of October, 1989

*Attest:*

DONALD J. QUIGG

*Attesting Officer*     *Commissioner of Patents and Trademarks*